United States Patent
Lebby et al.

(10) Patent No.: US 7,388,230 B1
(45) Date of Patent: Jun. 17, 2008

(54) SELECTIVE COLORED LIGHT EMITTING DIODE

(76) Inventors: Michael Lebby, 30 N. La Barge Rd., Apache Junction, AZ (US) 85219; Vijit Sabnis, 2240 Homestead Ct., Apt 116, Los Altos, CA (US) 94024; Petar B. Atanackovic, 1050 Waverly St., Palo Alto, CA (US) 94301

( * ) Notice: Subject to any disclaimer, the term of this patent is extended or adjusted under 35 U.S.C. 154(b) by 381 days.

(21) Appl. No.: 11/257,597

(22) Filed: Oct. 26, 2005

(51) Int. Cl.
*H01L 33/00* (2006.01)
*H01L 21/00* (2006.01)

(52) U.S. Cl. .............................. 257/89; 257/90; 438/34; 438/46

(58) Field of Classification Search .................. 438/22, 438/34, 35, 39, 46, 47; 257/14, 15, 18, 22, 257/89, 90, 102
See application file for complete search history.

(56) References Cited

U.S. PATENT DOCUMENTS 6,831,304 B2 * 12/2004 Udagawa ...................... 257/94
7,135,699 B1 * 11/2006 Atanackovic ................ 257/22

\* cited by examiner

*Primary Examiner*—Kevin M Picardat

(57) ABSTRACT

A selective colored LED includes a light emitting area epitaxially grown on a first cladding layer, and a second cladding layer epitaxially grown on the light emitting area. The light emitting area includes at least one thin single crystal layer of rare earth material having at least one radiative transition producing a radiation wavelength of a selected color. The first cladding layer is positioned on a first mirror stack, with pairs of mirrors having an effective thickness of at least one half wavelength of the selected color, and a second mirror stack is positioned on the second cladding layer. Generally, the color of the LED is determined by selecting a rare earth with a radiative transition producing a radiation wavelength at the selected color. In cases where the rare earth has more than one radiative transition, tuned mirrors can be used to select the desired color.

24 Claims, 3 Drawing Sheets

SELECTIVE COLORED LIGHT EMITTING DIODE

FIELD OF THE INVENTION

This invention relates in general to light emitting diodes, and more particularly to selectively colored light emitting diodes and methods of fabrication.

BACKGROUND OF THE INVENTION

Light emitting diodes (LEDs) are utilized in a great variety of devices to provide indicators, lighting devices, displays, etc. In this disclosure it should be understood that the term light emitting diode (LED) includes any of the well known light emitting devices, such as simple diodes, enhanced or super-emitting diodes, any of the various laser diodes including vertical cavity surfaces emitting lasers (VCSEL), etc. For purposes of differentiation, simple light emitting diodes include spontaneous emission while laser type diodes include stimulated emission.

The major problem with LEDs is that they can be difficult to produce in any specific color. For example, in a full color display, a red, green, and blue or blue green diode must be included in each pixel to produce full color when the emitted colors are combined in the correct amounts. Producing LEDs that emit any desired or selected color can be difficult and in many instances expensive.

It would be highly advantageous, therefore, to remedy the foregoing and other deficiencies inherent in the prior art.

Accordingly, it is an object of the present invention to provide a new and improved selective colored light emitting diode.

Another object of the invention is to provide a new and improved method of fabricating selective colored light emitting diodes.

Another object of the invention is to provide a new and improved selective colored light emitting diode that is easier to fabricate in any selected color.

Another object of the invention is to provide a new and improved selective colored light emitting diode that can be produced using standard or well known semiconductor manufacturing techniques.

Another object of the invention is to provide new and improved selective colored light emitting diodes in which substantially any color of emission can be selected.

SUMMARY OF THE INVENTION

Briefly, to achieve the desired objects of the instant invention in accordance with a preferred embodiment thereof, a selective colored light emitting diode is provided having a light emitting region including a light emitting area with at least one thin single crystal layer of rare earth material. The rare earth material has at least one radiative transition producing a radiation wavelength of a selected color. Generally, the color of the LED is determined by selecting a rare earth with a radiative transition producing a radiation wavelength at the selected color. In cases where the rare earth has more than one radiative transition producing radiation wavelengths of different colors, mirrors or other tuning apparatus can be used to select the desired color.

The desired objects and purposes of the present invention are further realized in a method of fabricating a selective colored light emitting diode including the step of selecting a rare earth material having at least one radiative transition producing a radiation wavelength of a selected color. The method then includes forming a first cladding layer of intrinsic single crystal semiconductor material, forming a light emitting area including at least one thin single crystal layer of the selected rare earth material on the first cladding layer; and forming a second cladding layer of intrinsic single crystal semiconductor material on the light emitting area.

The desired objects and purposes of the present invention are further realized in a preferred embodiment wherein a selective colored light emitting diode includes a light emitting area epitaxially grown on an intrinsic single crystal semiconductor first cladding layer, and a second intrinsic single crystal semiconductor cladding layer epitaxially grown on the light emitting area. The light emitting area includes at least one thin single crystal layer of rare earth material having at least one radiative transition producing a radiation wavelength of a selected color. A first mirror stack, with pairs of mirrors having an effective thickness of at least one half wavelength of the selected color, is positioned on the first cladding layer. A second mirror stack, with pairs of mirrors having an effective thickness of at least one half wavelength of the selected color, is positioned on the second cladding layer. In applications where the single crystal layer of rare earth material has more than one radiative transition, the desired color emission can be selected by tuning the mirrors to the correct wavelength.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
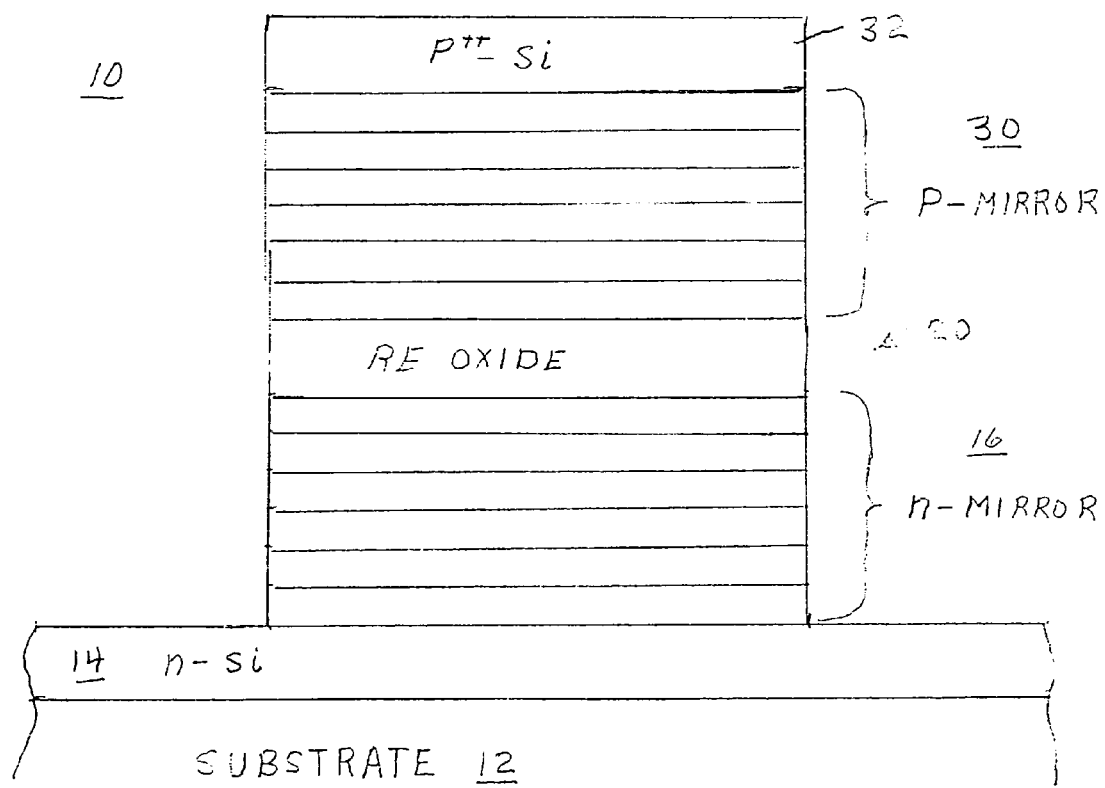
FIG. 1 is a simplified sectional view of an LED in accordance with the present invention.

Turning now to FIG. 1, a simplified sectional view of an LED 10, in accordance with the present invention, is illustrated. LED 10 is fabricated on a substrate 12, which in this embodiment includes single crystal silicon. However, substrate 12 is primarily a supporting structure and may be anything that provides the desired result. Throughout this example, silicon is used because most of the semiconductor industry is adapted to its use and working with silicon is well developed. It should, however, be understood that other materials might be used and silicon is only used in this description for exemplary purposes. Generally, the semiconductor material used is transparent to the emitted light.

In FIG. 1, a layer 14 of n-doped silicon is deposited on the surface of substrate 12 to provide the desired conductivity. In some embodiments layer 14 may be an enhanced or purer single crystal layer (i.e. grown on substrate 12 in a purer form) to enhance further single crystal growth. In some embodiments layer 14 can be heavily doped to provide a lower contact layer or substrate 12 can be doped with a contact on the rear surface thereof in a well known manner. In this disclosure, for purposes of simplicity of understanding, layer 14 and/or any additional or alternative layers are considered a part of the substrate structure. Also, in this embodiment layer 14 is an n-doped silicon layer for purposes of explanation but those skilled in the art will understand that the specific doping illustrated could be reversed or otherwise altered if desired.

A first mirror stack 16 of mirror pairs is formed on the surface of layer 14 using any of the well known deposition or epitaxial growth techniques. As is known in the art, each mirror pair includes layers of single crystal semiconductor material with different indices of refraction. Also, the thickness of a mirror pair is effectively a half wavelength, or multiple thereof, of the emitted light. Thus, each mirror pair reflects some of the emitted light back toward the emission center. Also, in this embodiment, each mirror pair in stack 16 includes materials that are relatively simple to deposit, such as silicon/silicon dioxide (Si/SiO$_2$) or silicon/RE Oxide but are transparent to the emitted light. Further, for purposes of this explanation, the layers of mirror stack 16 are n-doped to provide the required conductivity for a diode.

A light emitting region 20 is formed on the upper surface of mirror stack 16 and in this specific embodiment includes one or more (e.g. a super lattice) thin single crystal layers of rare earth (RE) material (rare earth oxide, nitride, oxynitride, etc.) As will be described in more detail below, the specific rare earth material used in the formation of light emitting region 20 can determine the emitted wavelength or emission color. In applications where a rare earth material with more than one radiative transition is used the mirror stack or stacks are tuned to the desired output wavelength.

A second mirror stack 30 of mirror pairs is formed on the upper surface of upper contact region 29 using any of the well known deposition or epitaxial growth techniques. As explained above, each mirror pair includes layers of single crystal semiconductor material with different indices of refraction and a thickness effectively a half wavelength, or multiple thereof, of the emitted light. Thus, each mirror pair reflects some of the emitted light back to the emission center. If LED 10 is intended to be only a simple LED, mirror stack 30 may reflect less light or, in some applications, may be completely eliminated. For purposes of differentiation, simple light emitting diodes include spontaneous emission while laser type diodes include stimulated emission. In the present embodiment the spontaneous emission is in the order of approximately 95% of the emitted light while approximately 5% or less is stimulated emission.

In this preferred, embodiment mirror stack 30 includes materials that are relatively simple to deposit, such as silicon/silicon dioxide (Si/SiO$_2$) or silicon/RE Oxide, p-doped to provide the required conductivity for a diode. It will of course be understood that, while mirror stack 30 is described as a semiconductor stack, it could be any of the distributed Bragg reflectors (DBRs) well known in the industry. Typically, DBRs or mirror stacks are formed of a material system generally consisting of two materials having different indices of refraction and being easily lattice matched to the other portions of the LED, however, other DBRs (dielectric stacks, etc.) can be provided using other techniques, e.g., wafer bonding or the like.

A heavily p-doped contact layer 32 is formed on the upper surface of upper mirror stack 30 to provide a second contact for LED 10. It will be understood that contact layer 32 may be omitted and a contact layer placed directly on light emitting region 20. This is especially true if upper mirror stack 30 is, for example, a dielectric (non-electrically conducting) DBR or if upper mirror stack 30 is not present.

Figure 2:
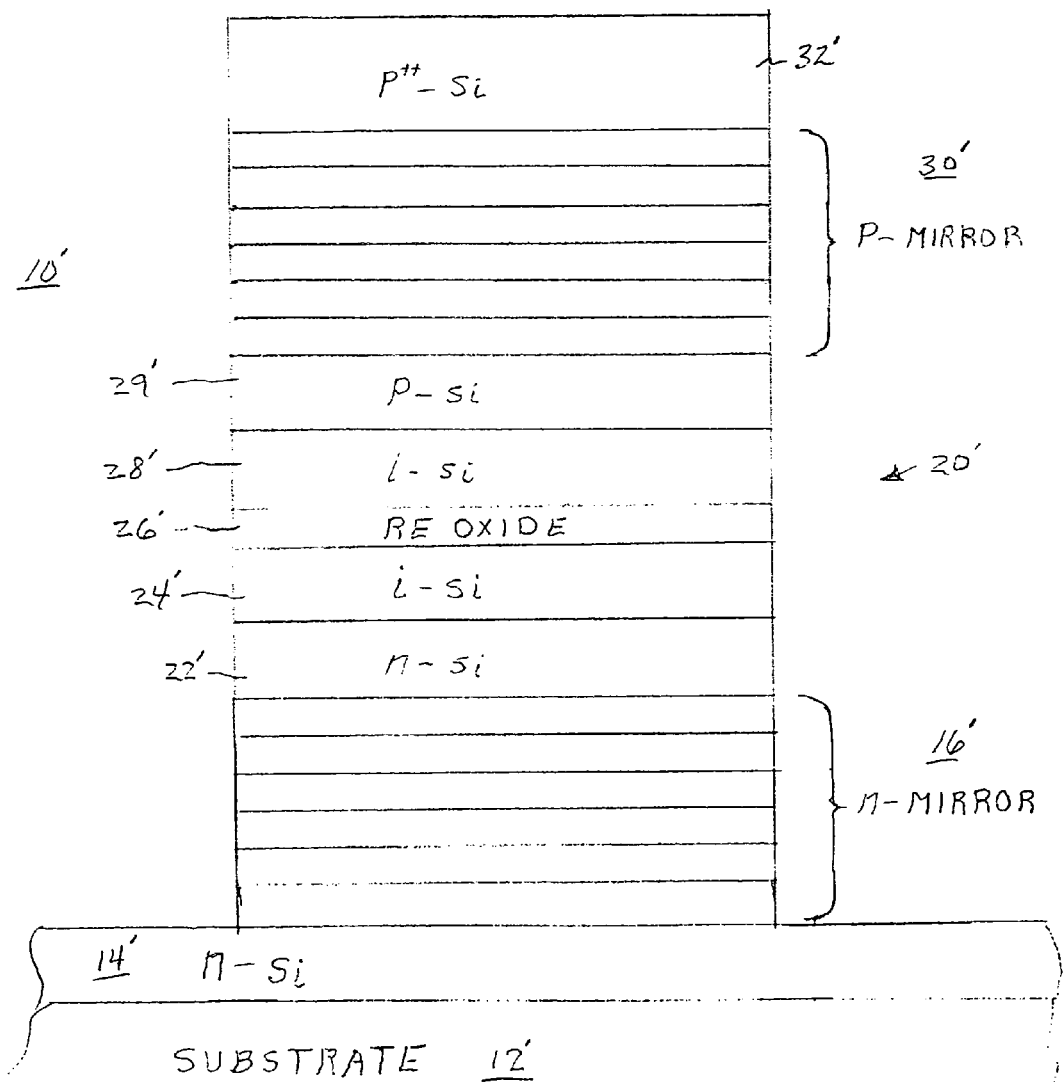
FIG. 2 is a simplified sectional view of another embodiment of an LED in accordance with the present invention.

Turning now to FIG. 2, a simplified sectional view of another embodiment of an LED, generally designated 10', in accordance with the present invention, is illustrated. In this embodiment components similar to components in FIG. 1 are designated with similar numbers and a prime (') is added to denote the different embodiment. LED 10' is fabricated on a substrate 12', which in this embodiment includes single crystal silicon. However, substrate 12' is primarily a supporting structure and may be anything that provides the desired result. Throughout this example, silicon is used because most of the semiconductor industry is adapted to its use and working with silicon is well developed. It should, however, be understood that other materials might be used and silicon is only used in this description for exemplary purposes.

In FIG. 2, a layer 14' of n-doped silicon is deposited on the surface of substrate 12' to provide the desired conductivity. In some embodiments layer 14' may be an enhanced or purer single crystal layer (i.e. grown on substrate 12' in a purer form) to enhance further single crystal growth. In some embodiments layer 14' can be heavily doped to provide a lower contact layer or substrate 12' can be doped with a contact on the rear surface thereof in a well known manner. In this disclosure, for purposes of simplicity of understanding, layer 14' and/or any additional or alternative layers are considered a part of the substrate structure. Also, in this embodiment layer 14' is an n-doped silicon layer for purposes of explanation but those skilled in the art will understand that the specific doping illustrated could be reversed or otherwise altered if desired.

A first mirror stack 16' of mirror pairs is formed on the surface of layer 14' using any of the well known deposition or epitaxial growth techniques. As is known in the art, each mirror pair includes layers of single crystal semiconductor material with different indices of refraction. Also, the thickness of a mirror pair is effectively a half wavelength, or multiple thereof, of the emitted light. Thus, each mirror pair reflects some of the emitted light back to the emission center. Generally, the total emission of a mirror stack should be in excess of 95% of the emitted light if lasing is desired (stimulated emission). If the device is intended to be only a simple LED, mirror stack 16' may reflect less light or, in some applications, may be completely eliminated. However, in this preferred embodiment mirror stack 16' is included to enhance the light output of LED 10'. Also, in this embodiment, each mirror pair in stack 16' includes materials that are relatively simple to deposit, such as silicon/silicon dioxide (Si/SiO$_2$) or silicon/RE Oxide. Throughout this disclosure it will be understood that all semiconductor materials do not conduct all visible light and the semiconductor materials used in the LEDs are generally transparent to the particular light being emitted. Further, for purposes of this explanation, the layers of mirror stack 16' are n-doped to provide the required conductivity for a diode.

A light emitting region 20' is formed on the upper surface of mirror stack 16' and in this specific embodiment includes a lower contact layer 22', one or more layers of cladding 24' (hereinafter "cladding layer 24"), a light emitting area 26', one or more layers of cladding 28' (hereinafter "cladding layer 28"), and an upper contact layer 29'. It will of course be understood that contact layers 22' and 29' are included in light emitting region 20' in this discussion only for purposes of simplicity of understanding and may be included or omitted in some embodiments. Also, it should be understood that light emitting area 26' and cladding layers 24' and 28' can be formed with an effective thickness of one or more wavelengths or fractions of wavelengths of the selected light to be emitted for purposes of lasing but may be any convenient thickness for simple light emitting diodes (spontaneous emission).

In this embodiment, lower contact region 22' is formed of single crystal n-doped silicon, and can be formed, for example, by epitaxially growing the crystalline silicon on the upper surface of mirror stack 16. Lower cladding layer 24' is formed of intrinsic, or un-doped, single crystal silicon. Light emitting area 26' is formed of one or more (e.g. super lattice) thin single crystal layers of rare earth (RE) material (rare earth oxide, nitride, oxynitride, etc.) defining one or more light emitting structures, preferably epitaxially grown on the surface of the single crystal un-doped silicon lower cladding layer 24'. Upper cladding layer 28' is formed of intrinsic, or un-doped, single crystal silicon, preferably epitaxially grown on the upper surface of light emitting area 26'. Upper contact region 29' is formed of single crystal p-doped silicon, and can be formed, for example, by epitaxially growing the crystalline silicon on the upper surface of upper cladding layer 28'.

A second mirror stack 30' of mirror pairs is formed on the upper surface of upper contact region 29' using any of the well known deposition or epitaxial growth techniques. As explained above, each mirror pair includes layers of single crystal semiconductor material with different indices of refraction and a thickness effectively a half wavelength, or multiple thereof, of the emitted light. Thus, each mirror pair reflects some of the emitted light back to the emission center. If LED 10' is intended to be only a simple LED, mirror stack 30' may reflect less light or, in some applications, may be completely eliminated.

In this preferred, embodiment mirror stack 30' includes materials that are relatively simple to deposit, such as silicon/silicon dioxide (Si/SiO$_2$) or silicon/RE Oxide, p-doped to provide the required conductivity for a diode. It will of course be understood that, while mirror stack 30' is described as a semiconductor stack, it could be any of the distributed Bragg reflectors (DBRs) well known in the industry. Typically, DBRs or mirror stacks are formed of a material system generally consisting of two materials having different indices of refraction and being easily lattice matched to the other portions of the LED, however, other DBRs (dielectric stacks, etc.) can be provided using other techniques, e.g., wafer bonding or the like.

A heavily p-doped contact layer 32' is formed on the upper surface of upper mirror stack 30' to provide a second contact for LED 10'. It will be understood that contact layer 32' may be omitted and contact layer 29' may serve as the upper contact in some embodiments. This is especially true if upper mirror stack 30' is, for example, a dielectric (non-electrically conducting) DBR or if upper mirror stack 30' is not present.

Figure 3:
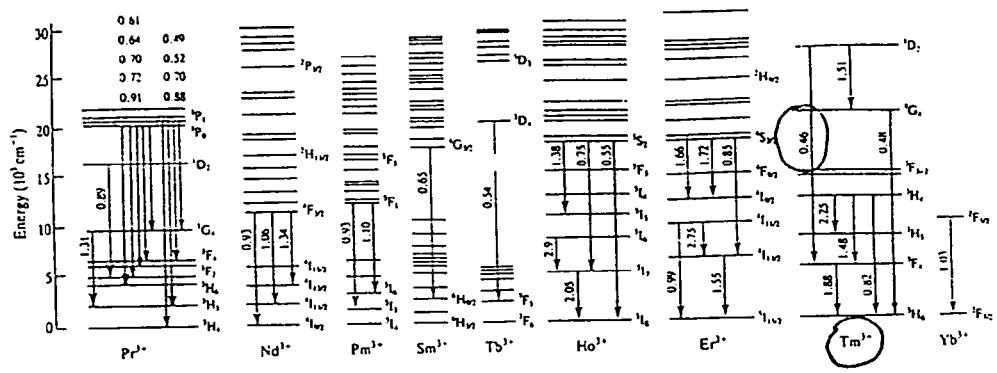
FIGS. 3 and 4 graphically illustrate some materials that can be used in the LEDs of FIG. 1 or 2 to provide selected colors.
Figure 4:
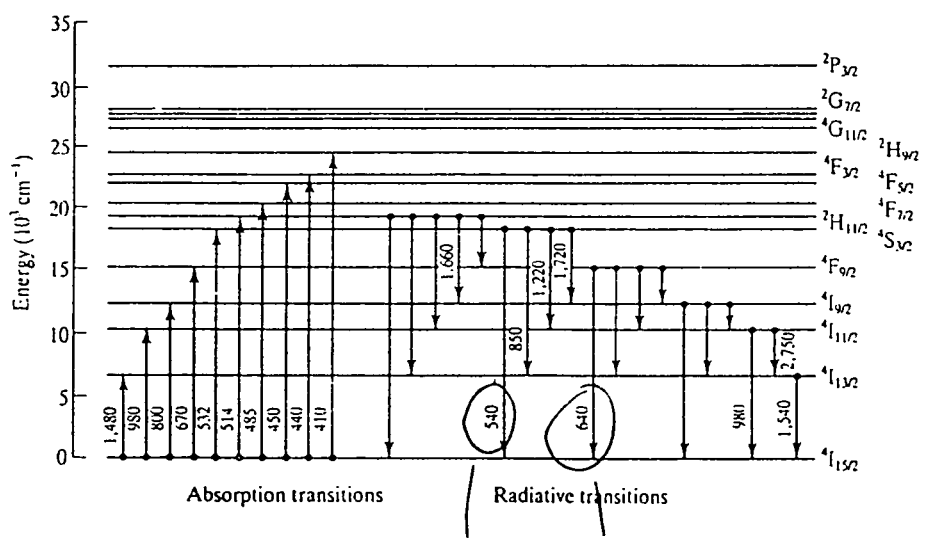

Referring additionally to FIG. 3, some typical rare earths that can be included in light emitting region 20 of FIG. 1 or light emitting region 20' of FIG. 2 are illustrated. The rare earths illustrated are, from left to right, Praseodymium (Pr), Neodymium (Nd), Promethium (Pm), Samarium (Sm), Terbium (Tb), Holmium (Ho), Erbium (Er), Thulium (Tm), and Ytterbium (Yb). Various radiative transitions for each of the rare earths are illustrated to show potential emission colors for each rare earth. As an example, Thulium (Tm) has a radiative transition of 0.46 (460 nm), which is a blue-green wavelength. Referring additionally to FIG. 4, some further radiative transitions that can be formed in Erbium (Er) are illustrated. Here, for example, it will be noted that radiative transitions at 540 nm, a green wavelength, and 640 nm, a red wavelength, are available.

Using the information provided above for rare earth materials and referring back to LED 10 of FIG. 1 or LED 10' of FIG. 2, LEDs that emit different colored light can be provided. The colored light selection is accomplished by choosing a rare earth with a radiative transition at the wavelength of desired light, for example, Thulium (Tm) with a radiative transition of 0.46 (460 nm). In this fashion, by choosing a rare earth with a radiative transition at the wavelength of desired light, LEDs can be manufactured that emit substantially any desired color.

To further enhance the light emission, mirror stack 16 of LED 10 is formed so that each mirror pair in stack 16 has an effective thickness of one half wavelength at the 460 nm radiation. Mirror stack 30 of LED 10 is formed so that each mirror pair in stack 30 has an effective thickness of one half wavelength at the 460 nm radiation. Thus, LED 10 is effectively tuned to emit light with a 460 nm wavelength.

In the case of a rare earth, such as Erbium (Er), with multiple radiative transitions in the visible light range, the mirror stacks can be tuned to a chosen one of the radiative transitions so that a selected light is emitted and the other radiative transitions have no effect. Also, in LED 10' light emitting region 20' can be tuned to the chosen radiative transition. For example, if Erbium (Er) material is used in light emitting area 26', the mirror stacks and the light emitting region 20' can be tuned to either 540 nm, to emit green light, or to 640 nm, to emit red light. Here it should be understood that tuning light emitting region 20' for a selected color may be sufficient in some simplified embodiments and mirror stacks may not be included. Further, in other embodiments, mirror stacks 16 or 16' and/or mirror stacks 30 or 30' may be greatly reduced (a lesser number of pairs) or omitted while still achieving sufficient selectivity for a specific application. It will be understood, however, that LED 10 with at least some mirror stack on the top and bottom is the preferred embodiment to achieve the purest light.

Thus, a new and improved selective colored light emitting diode is disclosed along with an improved method of fabricating selective colored light emitting diodes. The new and improved selective colored light emitting diode can be produced using standard or well known semiconductor manufacturing techniques. Further, the new and improved selective colored light emitting diode can be produced with substantially any color (wavelength) of emission selected.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A selective colored light emitting diode comprising:
   a first electrical contact;
   a light emitting region including at least one layer of single crystal rare earth material with one side positioned in electrical communication with the first electrical contact, the rare earth material having at least one radiative transition producing a radiation wavelength of a selected color, and the light emitting region tuned to the radiation wavelength of the radiative transition; and
   a second electrical contact positioned in electrical communication with an opposite side of the at least one layer of single crystal rare earth material.

2. A selective colored light emitting diode as claimed in claim 1 further including a substrate and the first electrical contact is positioned on the substrate.

3. A selective colored light emitting diode as claimed in claim 2 further including a first mirror positioned on the substrate, the one side of the light emitting region being positioned on the first mirror.

4. A selective colored light emitting diode as claimed in claim 3 wherein the first mirror includes a mirror stack including a plurality of mirror pairs, and each mirror pair having an effective thickness of at least one half wavelength at the radiation wavelength of the selected color.

5. A selective colored light emitting diode as claimed in claim 4 further including a second mirror stack positioned on the opposite side of the light emitting region, the second mirror stack including a plurality of mirror pairs, and each mirror pair having an effective thickness of at least one half wavelength at the radiation wavelength of the selected color.

6. A selective colored light emitting diode as claimed in claim 5 wherein the second mirror stack includes one of pairs of single crystal semiconductor layers and a dielectric DBR.

7. A selective colored light emitting diode as claimed in claim 1 constructed to emit a majority of spontaneous emission.

8. A selective colored light emitting diode as claimed in claim 7 wherein the spontaneous emission is approximately 95% of the total emission and stimulated emission is approximately 5% of the total emission.

9. A selective colored light emitting diode comprising:
a first electrical contact;
a light emitting region including a first cladding layer formed of intrinsic single crystal semiconductor material in electrical communication with the first electrical contact, a light emitting area grown on the first cladding layer and including at least one thin single crystal layer of rare earth material, the rare earth material having at least one radiative transition producing a radiation wavelength of a selected color, and a second cladding layer of intrinsic single crystal semiconductor material grown on the light emitting area, the first cladding layer, the light emitting area, and the second cladding layer forming a resonant cavity, and the laser cavity having a resonance frequency at the radiation wavelength of the radiative transition; and
a second electrical contact positioned in electrical communication with the second cladding layer.

10. A selective colored light emitting diode as claimed in claim 9 wherein the intrinsic single crystal semiconductor material in the first cladding layer includes silicon.

11. A selective colored light emitting diode as claimed in claim 9 wherein the intrinsic single crystal semiconductor material in the second cladding layer includes silicon.

12. A selective colored light emitting diode as claimed in claim 9 wherein the radiation wavelength of the selected color is one of 540 nm and 640 nm.

13. A selective colored light emitting diode as claimed in claim 9 further including a first mirror stack, the first cladding layer is positioned on the first mirror stack, the first mirror stack including a plurality of mirror pairs, and each mirror pair having an effective thickness of at least one half wavelength at the radiation wavelength of the selected color.

14. A selective colored light emitting diode as claimed in claim 13 wherein the first mirror stack includes pairs of single crystal semiconductor layers.

15. A selective colored light emitting diode as claimed in claim 14 wherein the single crystal semiconductor layers are selected from Si, $SiO_2$, and rare earth oxide.

16. A selective colored light emitting diode as claimed in claim 9 further including a second mirror stack positioned on the second cladding layer, the second mirror stack including a plurality of mirror pairs, and each mirror pair having an effective thickness of at least one half wavelength at the radiation wavelength of the selected color.

17. A selective colored light emitting diode as claimed in claim 16 wherein the second mirror stack includes one of pairs of single crystal semiconductor layers and a dielectric DBR.

18. A selective colored light emitting diode comprising:
a light emitting region including a first cladding layer formed of intrinsic single crystal semiconductor material, a light emitting area grown on the first cladding layer and including at least one thin single crystal layer of rare earth material, the rare earth material having at least one radiative transition producing a radiation wavelength of a selected color, and a second cladding layer of intrinsic single crystal semiconductor material grown on the light emitting area, the first cladding layer, the light emitting area, and the second cladding layer forming a laser cavity, and the laser cavity having a resonance frequency at the radiation wavelength of the radiative transition;
a first mirror stack, the first cladding layer being positioned on the first mirror stack, the first mirror stack including a plurality of mirror pairs, and each mirror pair having an effective thickness of at least one half wavelength at the radiation wavelength of the selected color; and
a second mirror stack positioned on the second cladding layer, the second mirror stack including a plurality of mirror pairs, and each mirror pair having an effective thickness of at least one half wavelength at the radiation wavelength of the selected color.

19. A selective colored light emitting diode as claimed in claim 18 wherein the second mirror stack includes one of pairs of single crystal semiconductor layers and a dielectric DBR.

20. A method of fabricating a selective colored light emitting diode comprising the steps of:
forming a first cladding layer of intrinsic single crystal semiconductor material;
selecting a rare earth material having at least one radiative transition producing a radiation wavelength of a selected color;
forming a light emitting area including at least one thin single crystal layer of the selected rare earth material on the first cladding layer;
forming a second cladding layer of intrinsic single crystal semiconductor material on the light emitting area; and
the steps of forming the first cladding layer, forming the light emitting area, and forming the second cladding layer including forming a resonant cavity having a resonance frequency at the radiation wavelength of the radiative transition.

21. A method as claimed in claim 20 wherein the steps of forming the first cladding layer, forming the light emitting area, and forming the second cladding layer all include epitaxially growing the first cladding layer, the light emitting area, and the second cladding layer.

22. A method as claimed in claim 20 including a step of providing a first mirror stack and forming the first cladding layer on the first mirror stack.

23. A method as claimed in claim 20 including a step of providing a second mirror stack and positioning the second mirror stack on the second cladding layer.

24. A method of fabricating a selective colored light emitting diode comprising the steps of:

providing a substrate;

selecting a rare earth material having at least one radiative transition producing a radiation wavelength of a selected color;

epitaxially growing a first mirror stack on the substrate, the first mirror stack including a plurality of mirror pairs, and each mirror pair having an effective thickness of at least one half wavelength at the selected color;

epitaxially growing a first cladding layer of intrinsic single crystal semiconductor material on the first mirror stack;

epitaxially growing a light emitting area including at least one thin single crystal layer of the selected rare earth material on the first cladding layer;

epitaxially growing a second cladding layer of intrinsic single crystal semiconductor material on the light emitting area;

positioning a second mirror stack on the second cladding layer, the second mirror stack including a plurality of mirror pairs, and each mirror pair having an effective thickness of at least one half wavelength at the selected color; and the steps of epitaxially growing the first cladding layer, epitaxially growing the light emitting area, and epitaxially growing the second cladding layer including forming a resonant cavity having a resonance frequency at the radiation wavelength of the radiative transition.

* * * * *